US007528376B2

(12) United States Patent
Shoji

(10) Patent No.: US 7,528,376 B2
(45) Date of Patent: May 5, 2009

(54) PHOTO TIMER AND RADIOGRAPHIC APPARATUS

(75) Inventor: Takashi Shoji, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/194,763

(22) Filed: Aug. 2, 2005

(65) Prior Publication Data

US 2006/0023839 A1 Feb. 2, 2006

(30) Foreign Application Priority Data

Aug. 2, 2004 (JP) ............................ 2004-225521

(51) Int. Cl.
*H01L 27/146* (2006.01)

(52) U.S. Cl. ...................... 250/370.09; 378/96; 378/97; 378/108

(58) Field of Classification Search ............ 250/370.09; 378/96, 97, 108
See application file for complete search history.

(56) References Cited

U.S. PATENT DOCUMENTS 6,268,614 B1 7/2001 Imai
6,828,539 B1 12/2004 Kuwabara
2004/0114725 A1* 6/2004 Yamamoto .................. 378/189

FOREIGN PATENT DOCUMENTS

JP 60077400 A * 5/1985
JP 2000-10220 A 1/2000

* cited by examiner

*Primary Examiner*—Christine Sung
(74) *Attorney, Agent, or Firm*—Sughrue Mion, PLLC

(57) ABSTRACT

A photo timer includes an X-ray dose detector for detecting the dose of X-rays irradiated from an X-ray irradiation apparatus, a stop-signal output means for outputting a stop signal to stop irradiation of the X-rays from the X-ray irradiation apparatus when the detected X-ray dose exceeds a predetermined value, and a communication means for sending the stop signal to the X-ray irradiation apparatus by wireless means. A radiographic apparatus includes the photo timer, a solid state detector for recording image information by irradiation of X-rays which carry the image information and outputting an image signal representing the image information, and a communication means for sending the image signal to a photography control means by wireless means. Further, cables are not required to connect the X-radiographic apparatus (photo timer) and the X-ray irradiation apparatus, or the X-radiographic apparatus and the photography control means.

20 Claims, 4 Drawing Sheets

PHOTO TIMER AND RADIOGRAPHIC APPARATUS

BACKGROUND OF THE INVENTION

1. Field of the Invention

The present invention relates to a photo timer for controlling n irradiation apparatus so that the dose of radiation does not exceed predetermined value when a subject is irradiated with the radiation during radiography, or the like. The present invention also relates o a radiographic apparatus which includes the photo timer.

2. Description of the Related Art

Nowadays, various kinds of X-radiographic apparatuses have been proposed and are used in the field of X-radiography for medical diagnoses or the like. In the X-radiography, a solid state detector (which includes a semiconductor as its main part) is used as an X-ray image detection means. The solid state detector detects X-rays which have been transmitted through a subject and obtains an image signal representing an X-ray image related to the subject.

Further, various types of solid state detectors which may be used in the X-radiographic apparatuses have been proposed. For example, if the solid state detectors are classified according to an electric charge generation process for converting X-rays into electric charges, there are solid state detectors of a photo conversion type, solid state detectors of a direct conversion type, and the like. In the solid state detector of the photo conversion type, signal electric charges are obtained at a photo-conductive layer by detecting fluorescence emitted from phosphors which have been irradiated with X-rays. Then, the obtained signal electric charges are temporarily stored in a storage unit. The stored electric charges are converted into an image signal (electric signal), and the image signal is output. Meanwhile, in the solid state detector of the direct conversion type, when the photo-conductive layer is irradiated with X-rays, the signal electric charges are generated in the photo-conductive layer. The generated signal electric charges are collected at electric charge collection electrodes. The collected signal electric charges are temporarily stored in a storage unit. Then, the stored electric charges are converted into an electric signal, and the electric signal is output. The main parts of the solid state detector of this type are the photo-conductive layer and the electric charge collection electrodes.

If the solid state detectors are classified according to an electric charge readout process for reading out the electric charges stored in the solid state detectors to the outside of the solid state detectors, there are solid state detectors of a photo readout type, solid state detectors of a TFT readout type, and the like. In the solid state detector of the photo readout type, the solid state detector is irradiated with readout light (electromagnetic wave for readout), and the electric charges are read out from the solid state detector. In the solid state detector of the TFT readout type, as disclosed in U.S. Pat. No. 6,828,539, TFT's (thin-film transistors) are sequentially driven along scan lines, and the electric charges are read out from the solid state detector.

Further, solid state detectors of an improved direct conversion type have also been proposed in U.S. Pat. No. 6,268,614 and the like. The solid state detectors of the improved direct conversion type have both the characteristics of the direct conversion type and those of the photo readout type. In the solid state detectors of the improved direct conversion type, a photo-conductive layer for recording, an electric charge transfer layer, and a photo-conductive layer for readout are stacked together in this order. The photo-conductive layer for recording is a layer which becomes photo-conductive when it receives recording light (X-rays, fluorescence generated by irradiation of X-rays, or the like). The electric charge transfer layer is a layer which acts substantially as an insulator for an electric charge which has the same polarity as a latent image electric charge, and which acts substantially as a conductor for a transfer electric charge which has a polarity opposite to the latent image electric charge. The photo-conductive layer for readout becomes photo-conductive when it is irradiated with electromagnetic waves for readout. In the solid state detectors of the improved direct conversion type, signal electric charges (latent image electric charges) which carry image information are stored at the interface (storage unit) between the photo-conductive layer for recording and the electric charge transfer layer. Further, electrodes (a first conductive layer and a second conductive layer) are stacked at both sides of the three layers. The main parts of the solid state detector of this type are the photo-conductive layer for recording, the electric charge transfer layer, and the photo-conductive layer for readout.

Besides the apparatuses using the solid state detectors as described above, various kinds of X-ray image detection means such as imaging plates and films are used in medical radiography. In all of these cases, a photo timer is generally used during X-radiography. The photo timer is used to obtain a high-quality image and to prevent excessive irradiation of a patient during radiography. The photo timer is used to detect the dose of X-rays, with which the X-ray image detection means has been irradiated. Then, the detected X-ray dose is used to control the dose of X-rays, with which the patient is irradiated. Further, an X-radiographic apparatus of a cassette type, in which a photo timer as described above is incorporated, is proposed in Japanese Unexamined Patent Publication No. 2000-010220, for example.

However, when the photo timer as described above is used, it is required that an X-ray irradiation apparatus and the photo timer are connected to each other by a cable, and that the photo timer is placed close to the X-ray image detection means during photography. However, this configuration is not convenient for users. Further, in the X-radiographic apparatus of the cassette type, in which the photo timer is incorporated, as disclosed in Japanese Unexamined Patent Publication No. 2000-010220, it is also required that the incorporated photo timer and the X-ray irradiation apparatus are connected to each other by a cable. However, this configuration is not convenient for the users. Further, if they are connected by the cable, the flexibility in radiography is limited.

SUMMARY OF THE INVENTION

In view of the foregoing circumstances, it is an object of the present invention to provide a more convenient photo timer and a radiographic apparatus which includes the photo timer.

A photo timer according to the present invention is a photo timer comprising:

a radiation dose detector for detecting the dose of radiation irradiated from an external irradiation apparatus;

a stop-signal output means for outputting a stop signal for stopping irradiation from the irradiation apparatus when the radiation dose detector detects a radiation dose which is larger than or equal to a predetermined value; and a stop-signal communication means for sending the stop signal, which is output from the stop-signal output means, to the irradiation apparatus by wireless means.

Here, the "irradiation apparatus" is an apparatus including an irradiation unit for irradiating radiation and a controller for controlling the irradiation unit. If the irradiation unit and the controller are separate from each other, the stop signal may be sent to the controller.

A radiographic apparatus according to the present invention is a radiographic apparatus comprising:

a photo timer according to the present invention;

a solid state detector for recording image information by being irradiated with radiation which carries the image information and outputting an image signal representing the recorded image information; and an image-signal communication means for sending the image signal, output from the solid state detector, to an external apparatus by wireless means.

Here, the "solid state detector" is a detector which detects radiation carrying the image information of the subject and outputs an image signal representing a radiographic image related to the subject. The radiation which enters the solid state detector is directly converted into electric charges, or the radiation is converted into electric charges after it is temporarily converted into light. Then, the electric charges are output from the solid state detector to the outside of the solid state detector. Accordingly, the image signal representing the radiographic image related the subject can be obtained.

There are various kinds of solid state detectors. For example, if the solid state detectors are classified according to the electric charge generation process for converting the radiation into electric charges, there are the solid state detectors of the photo conversion type, solid state detectors of the direct conversion type, and the like. In the solid state detector of the photo conversion type, signal electric charges are obtained at a photo-conductive layer by detecting fluorescence emitted from a phosphor which is irradiated with X-rays. Then, the obtained signal electric charges are temporarily stored in a storage unit. The stored electric charges are converted into an image signal (electric signal), and the image signal is output. Meanwhile, in the solid state detector of the direct conversion type, the signal electric charges are generated in the photo-conductive layer when it is irradiated with the X-rays. The signal electric charges are collected at electric charge collection electrodes. The collected signal electric charges are temporarily stored in a storage unit. Then, the stored electric charges are converted into an electric signal, and the electric signal is output. If the solid state detectors are classified according to the electric charge readout process for reading out the electric charges stored in the solid state detectors to the outside of the solid state detectors, there are solid state detectors of a TFT readout type, solid state detectors of a photo readout type, or the like. In the solid state detector of the TFT readout type, the TFT's (thin-film transistors) connected to a storage unit are sequentially driven along scan lines, and the electric charges are read out from the solid state detector. In the solid state detector of the photo readout type, the solid state detector is irradiated with readout light (electromagnetic wave for readout), and the electric charges are read out from the solid state detector. Further, there are solid state detectors of an improved direct conversion type, as proposed in U.S. Pat. No. 6,268,614. The solid state detectors of the improved direct conversion type are solid state detectors which have both the characteristics of the direct conversion type and those of the photo readout type.

In the radiographic apparatus as described above, it is preferable that the stop-signal communication means and the image-signal communication means are configured so that communication from the stop-signal communication means and communication from the image-signal communication means do not interfere with each other.

The phrase "configured so that communication from the stop-signal communication means and communication from the image-signal communication means do not interfere with each other" refers to that the same communication method is used by both of the stop-signal communication means and the image-signal communication means, and that signals are multiplexed so that the communication from the stop-signal communication means and the communication from the image-signal communication means do not interfere with each other. The signals may be multiplexed, for example, by frequency division multiplexing, time division multiplexing, or packet division multiplexing. The interference may be also prevented by improving the directivity of wireless transmission. Alternatively, different communication methods may be used by the stop-signal communication means and the image-signal communication means so that the communication do not interfere with each other. As specific communication methods, various kinds of existing communication methods such as Bluetooth, HiSWANa (High Speed Wireless Access Network Type a), HiperLAN, wireless 1394, wireless USB (universal serial bus), UWB (Ultra Wide Band), or a wireless LAN (local area network) may be used.

The photo timer according to the present invention is a photo timer comprising:

a radiation dose detector for detecting the dose of radiation irradiated from an external irradiation apparatus;

a stop-signal output means for outputting a stop signal for stopping irradiation from the irradiation apparatus when the radiation dose detector detects a radiation dose which is larger than or equal to a predetermined value; and a stop-signal communication means for sending the stop signal, which is output from the stop-signal output means, to the irradiation apparatus by wireless means. Since the stop signal is sent to the irradiation apparatus by wireless means, it is not necessary to connect the photo timer and the irradiation apparatus to each other by a cable. Therefore, the convenience of the photo timer can be improved.

Further, the radiographic apparatus according to the present invention is a radiographic apparatus comprising:

a photo timer according to the present invention;

a solid state detector for recording image information by being irradiated with radiation which carries the image information and outputting an image signal representing the recorded image information; and an image-signal communication means for sending the image signal, output from the solid state detector, to an external apparatus by wireless means. The stop signal is sent from the radiographic apparatus to the irradiation apparatus by wireless means, and the image signal is also sent by wireless means from the radiographic apparatus to an external apparatus for processing the image signal. Therefore, it is not necessary to connect the radiographic apparatus and the irradiation apparatus to each other by a cable. Further, it is not necessary to connect the radiographic apparatus and the external apparatus by a cable. Therefore, the flexibility in photography is not limited by a cable, and the convenience of the radiographic apparatus can be improved.

DESCRIPTION OF THE PREFERRED EMBODIMENTS

Figure 1:
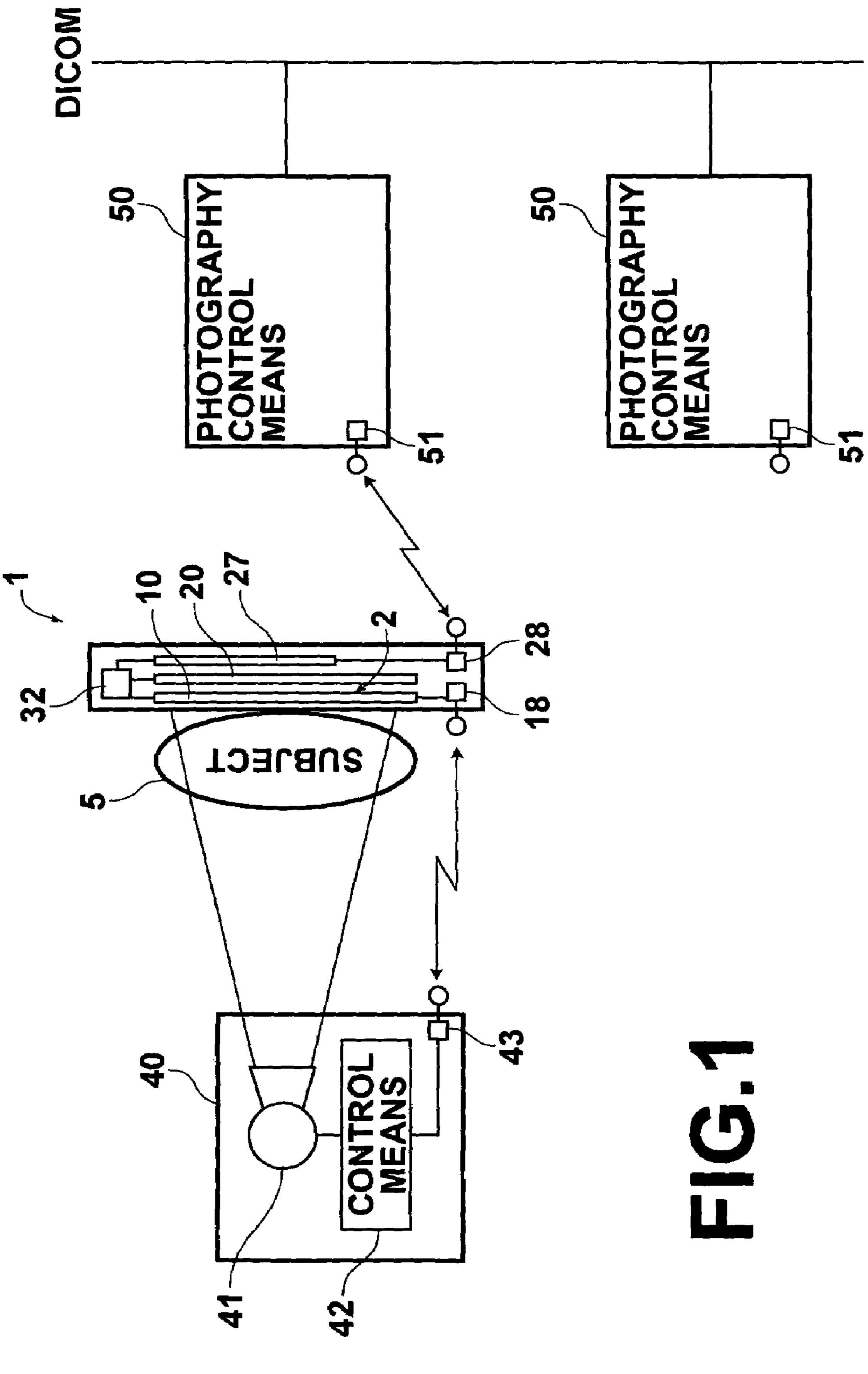
FIG. 1 is a schematic diagram illustrating an example of an X-radiographic system using a radiographic apparatus according to the present invention.
Figure 2:
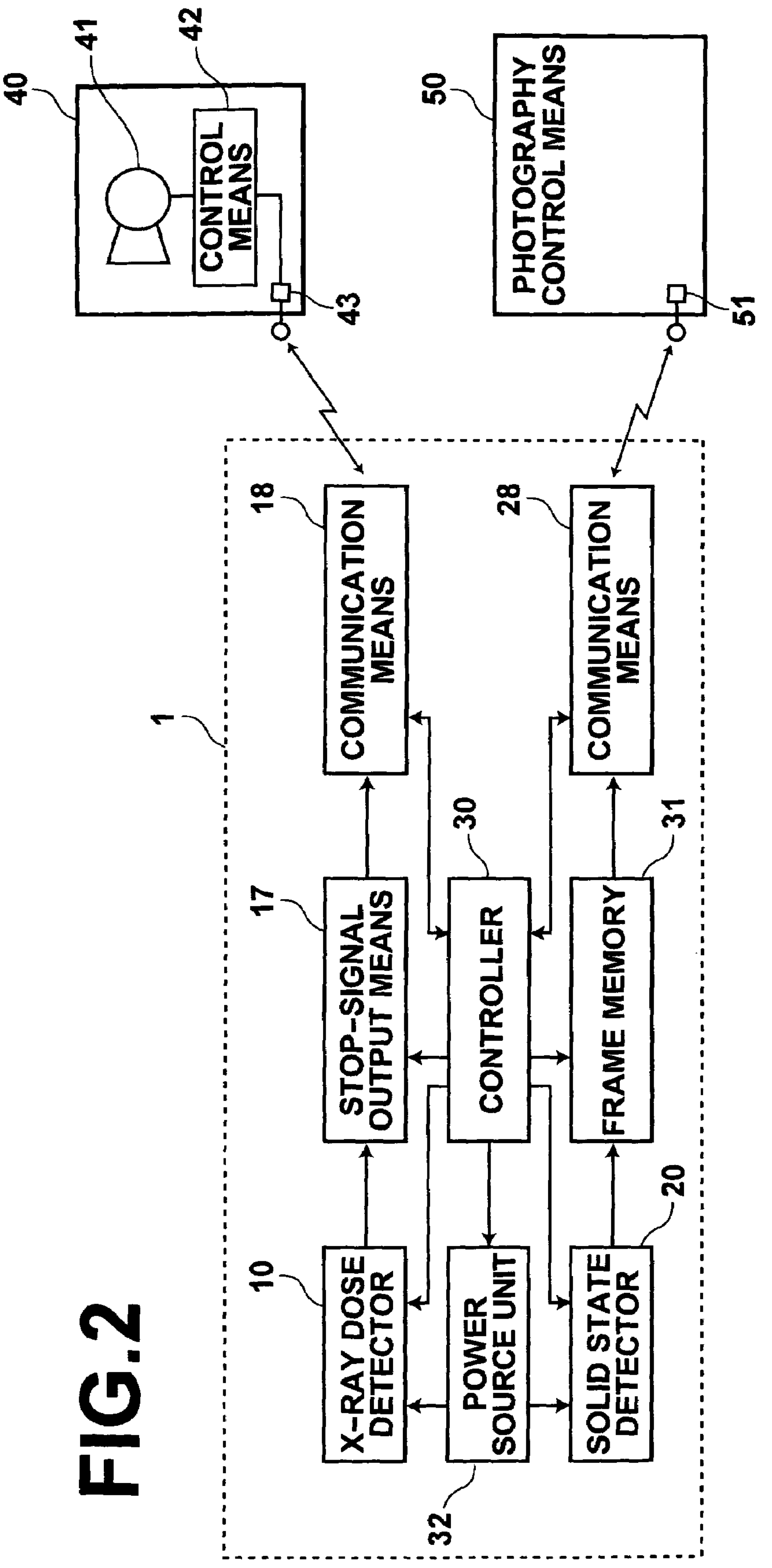
FIG. 2 is a schematic diagram illustrating the configuration of the X-radiographic system.
Figure 3:
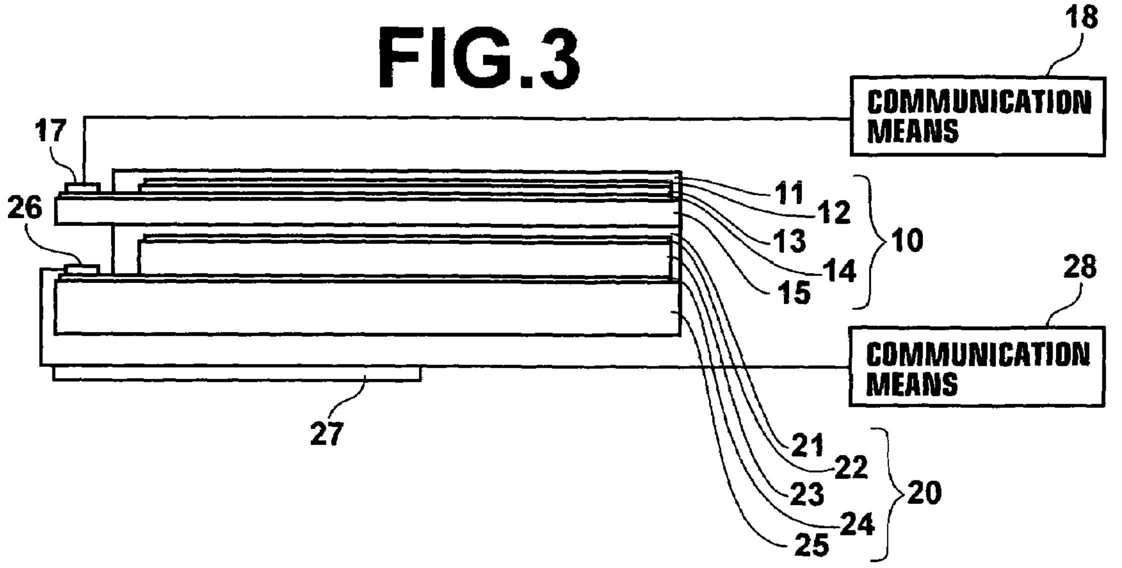
FIG. 3 is a schematic diagram illustrating the configuration of an X-ray dose detector, a solid state detector, and the like of the X-radiographic apparatus.
Figure 4:
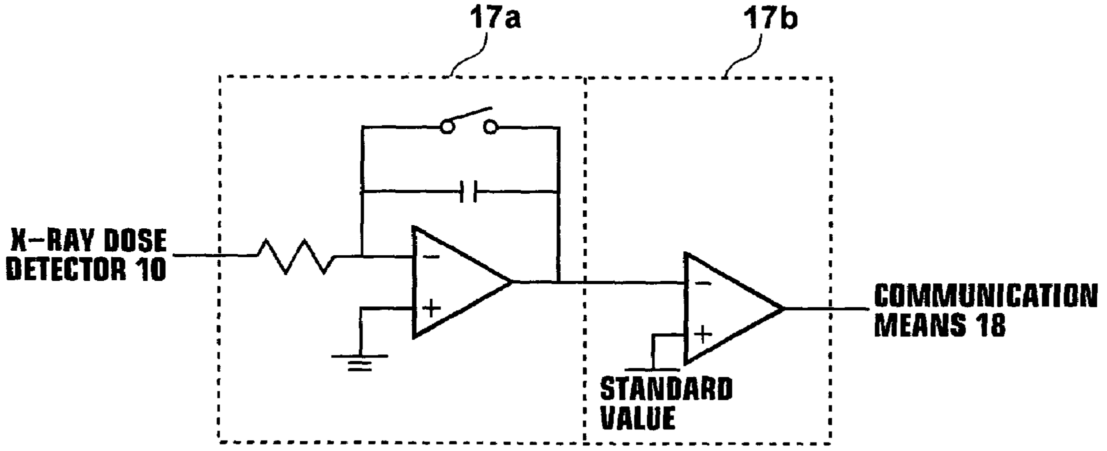
FIG. 4 is a schematic diagram illustrating the configuration of a stop-signal output means of the X-radiographic apparatus.

Hereinafter, embodiments of the present invention will be described in detail with reference to attached drawings. FIG. 1 is a schematic diagram illustrating an example of an X-radiographic system using a radiographic apparatus according to the present invention. FIG. 2 is a schematic diagram illustrating the configuration of the X-radiographic system. FIG. 3 is a schematic diagram illustrating the configuration of an X-ray dose detector, a solid state detector, and the like of the X-radiographic apparatus. FIG. 4 is a schematic diagram illustrating the configuration of a stop-signal output means of the X-radiographic apparatus.

The X-radiographic system includes an X-radiographic apparatus 1 of a cassette type, in which a photo timer 2, a solid state detector 20, and the like are incorporated. The X-radiographic system also includes an X-ray irradiation apparatus 40 for irradiating X-rays to the X-radiographic apparatus 1. The X-radiographic system also includes a photography control means 50 for controlling the X-radiographic apparatus 1 during photography.

The X-ray irradiation apparatus 40 includes an X-ray source 41, a control means 42 for controlling the X-ray source 41, and a communication means 43 for communicating with the X-radiographic apparatus 1.

The photography control means 50 controls the X-radiographic apparatus 1 based on an instruction input by a photographer during photography. The photography control means 50 also obtains an image signal from the X-radiographic apparatus 1. The photography control means 50 includes a communication means 51 for communicating with the X-radiographic apparatus 1. Further, the photography control means 50 is connected to a network such as DICCM (Digital Imaging and Communication in Medicine).

As illustrated in FIGS. 1 and 2, the photo timer 2 for controlling the X-ray irradiation apparatus 40, the solid state detector 20 which is an imaging device, and a printed circuit board 27 are provided in the X-radiographic apparatus 1. A controller 30 for controlling an operation of each unit of the X-radiographic apparatus 1, a frame memory 31, or the like is provided on the printed circuit board 27. Further, a communication means 28 for communicating with the photography control means 50 and a power source unit 32 for supplying electric power to each unit of the radiographic apparatus 1 are arranged in the X-ray irradiation apparatus 1.

The photo timer 2 includes an X-ray dose detector 10 for detecting an irradiated X-ray dose and a stop-signal output means 17 for outputting a stop signal, based on an output from the X-ray dose detector 10, to stop irradiation of X-rays from the X-ray irradiation apparatus 40. The photo timer 2 also includes a communication means 18 for communicating with the X-ray irradiation apparatus 40.

The X-ray dose detector 10 is formed by stacking a first conductive layer 14, a photo-conductive layer 13, a second conductive layer 12, and an insulative layer 11 in this order on a resin base plate 15. When the photo-conductive layer 13 is irradiated with X-rays, electric charges are generated, and it becomes photo-conductive. Further, the first conductive layer 14 is connected to the stop-signal output means 17.

In the X-ray dose detector 10, when an electric field is generated between the first conductive layer 14 and the second conductive layer 12, if the photo-conductive layer 13 is irradiated with X-rays, pairs of electric charges are generated in the photo-conductive layer 13. Then, an electric current corresponding to the amount of the pairs of electric charges flows between the first conductive layer 14 and the second conductive layer 12.

As illustrated in FIG. 4, the stop-signal output means 17 includes an integral circuit unit **17*a* and a comparison circuit unit 17*b*. In the integral circuit unit 17*a*, the electric current which has flowed between the first conductive layer 14 and the second conductive layer 12 is converted into a voltage, and the voltage is integrated. Further, in the comparison circuit unit 17*b*, if the voltage integrated in the integral circuit unit 17*a* exceeds a predetermined value, a stop signal for stopping irradiation of X-rays from the X-ray irradiation apparatus 40 is output. The stop-signal output from the comparison circuit 17*b* is sent to the X-ray irradiation apparatus 40 by the communication means 18**.

Appropriate X-ray doses vary depending on the subject of photography, a tube voltage at an X-ray source, a target material of the X-ray source, a radiation source filter, or the like. Therefore, it is preferable that a standard value (predetermined value) input to the comparison circuit unit **17*b*** is changed to an appropriate value based on the photography conditions as described above.

The solid state detector 20 is formed by stacking a first conductive layer 24 made of a —Si TFT (amorphous silicon thin film transistor), a photo-conductive layer 23, a second conductive layer 22, and an insulative layer 21 in this order on a glass base plate 25. The photo-conductive layer becomes conductive when electric charges are generated by being irradiated with X-rays.

A TFT corresponding to each pixel is formed in the first conductive layer 24. Each of the TFT's is connected to an IC chip 26, and output from each of the TFT's is sent to the IC chip 26. Further, the IC chip 26 is connected to the printed circuit board 27 which includes an A/D converter, which is not illustrated, the frame memory 31, and the like.

In the solid state detector 20, when an electric field is generated between the first conductive layer 24 and the second conductive layer 22, if the photo-conductive layer 23 is irradiated with X-rays, pairs of electric charges are generated in the photo-conductive layer 23. Then, latent image electric charges corresponding to the amount of the pairs of electric charges are stored in the first conductive layer 24. When the latent image electric charges stored in the first conductive layer 24 are read out, the TFT's in the first conductive layer 24 are sequentially driven, and a latent image electric charge corresponding to each of the pixels is read out. Accordingly, an electrostatic latent image carried by the latent image electric charges can be read out. The image signal which has been read out is output from the frame memory 31 to the communication means 28. Then, the communication means 28 sends the image signal to the photography control means 50.

The X-ray dose detector 10 as described above is stacked on the solid state detector 20. The X-ray dose detector 10 is placed so that it is positioned between the X-ray irradiation apparatus 40 and the solid state detector 20 during photography. Therefore, the X-ray dose detector 10 can directly detect the X-rays which are irradiated from the X-ray irradiation apparatus 40 before they are transmitted through the solid state detector 20. Accordingly, the X-ray dose detector 10 can accurately measure the X-ray dose without being influenced by the solid state detector 20.

The X-radiographic apparatus 1 (communication means 18) and the X-ray irradiation apparatus 40 (communication means 43) communicate with each other through a wireless LAN (local area network). Further, the X-radiographic apparatus 1 (communication means 28) and the photography control means 50 (communication means 51) also communicate with each other through a wireless LAN (local area network). The radiographic apparatus according to the present invention is configured so that the communication between The X-radiographic apparatus 1 (communication means 18) and the X-ray irradiation apparatus 40 (communication means 43) and the communication between the X-radiographic apparatus 1 (communication means 28) and the photography control means 50 (communication means 51) do not interfere with each other.

Specifically, both of the communication means 18 and the communication means 28, which are incorporated in the X-radiographic apparatus 1, are wireless LAN adaptors. The communication means 43 which is incorporated in the X-ray irradiation apparatus 40 is a wireless LAN access point. The communication means 51 which is incorporated in the photography control means 50 is also a wireless LAN access point. If the communication means 43 is set as the access destination of the communication means 18, and the communication means 51 is set as the access destination of the communication means 28, it is possible to communicate so that communication between the communication means 43 and the communication means 18 and communication between the communication means 51 and the communication means 28 do not interfere with each other.

Further, the communication method between the X-radiographic apparatus 1 and the X-ray irradiation apparatus 40 and the communication method between the X-radiographic apparatus 1 and the photography control means 50 are not limited to a method using a wireless LAN. Various kinds of communication methods may be used. Further, it is not necessary that the communication means incorporated in the X-radiographic apparatus 1 is separately provided for each of the X-ray irradiation apparatus 40 and the photography control means 50, as described above. A single communication means may be used to communicate with both the X-ray irradiation apparatus 40 and the photography control means 50.

As described above, the X-radiographic apparatus 1 and the X-ray irradiation apparatus 40 are connected by wireless means, and the X-radiographic apparatus 1 and the photography control means 50 are connected by wireless means. Therefore, it is not necessary to connect the X-radiographic apparatus 1 and the X-ray irradiation apparatus 40 by a cable. Further, it is not necessary to connect the X-radiographic apparatus 1 and the photography control means 50 by a cable. Since the flexibility in photography is not limited by a cable, the convenience of the X-radiographic apparatus 1 can be improved.

Figure 5:
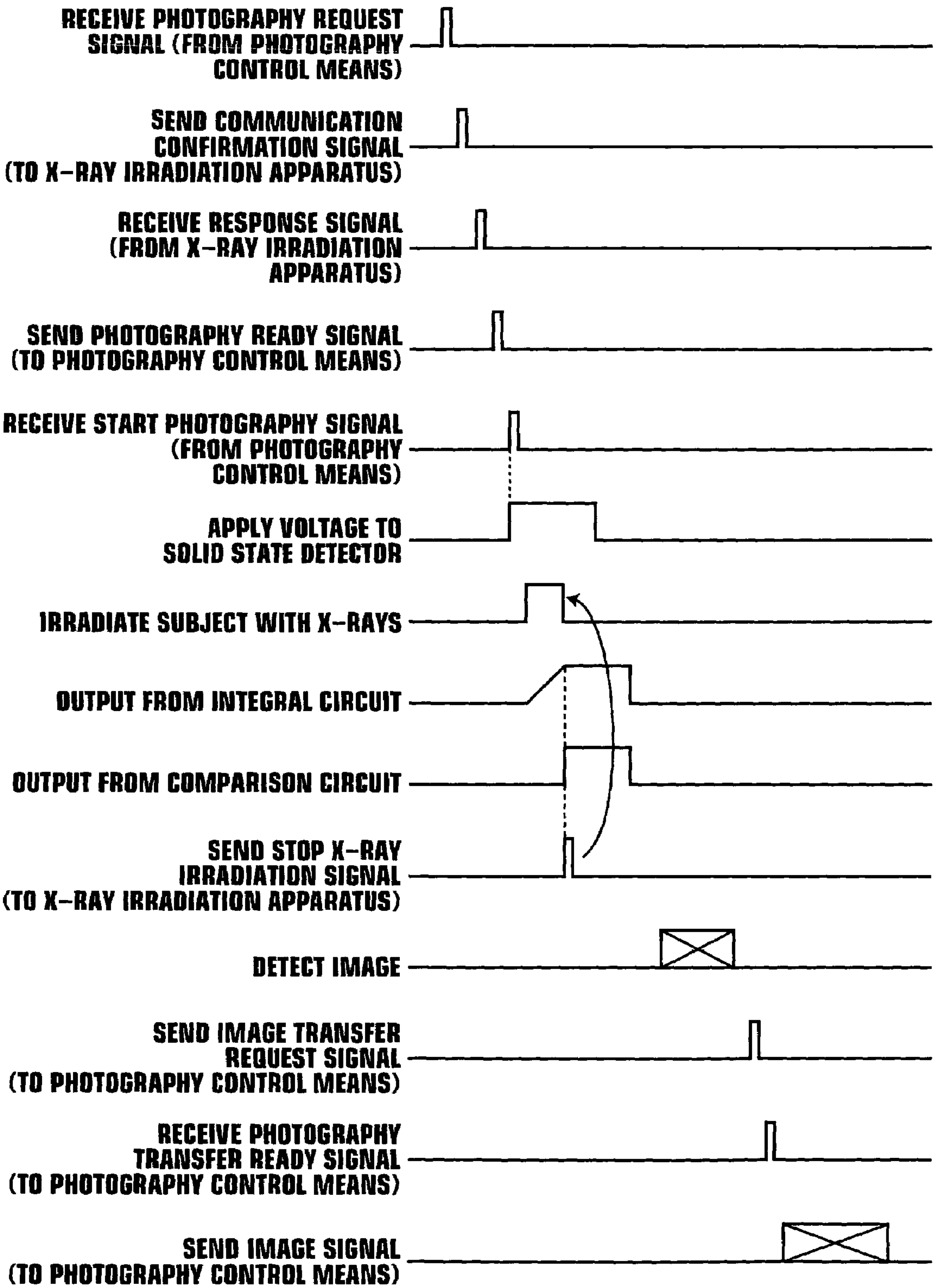
FIG. 5 is a timing chart illustrating the timing of operations which are mainly performed by the X-radiographic apparatus during photography.

Next, operations of the X-radiographic system will be described. FIG. 5 is a timing chart illustrating the timing of operations which are mainly performed by the X-radiographic apparatus during photography. Please note that the steps for sending or receiving signals in FIG. 5 are operations performed by the X-radiographic apparatus. Further, all of the operations by the X-radiographic apparatus 1 are controlled by the control means 30.

First, when a photographer inputs information that a photograph will be taken to the photography control means 50, the photography control means 50 sends a photography request signal to the X-radiographic apparatus 1.

When the X-radiographic apparatus 1 receives the photography request signal, the X-radiographic apparatus 1 sends a communication confirmation signal to the X-ray irradiation apparatus 40. When the X-ray irradiation apparatus 40 receives the communication confirmation signal, the X-ray irradiation apparatus 40 sends a response signal to the X-radiographic apparatus 1.

If the X-radiographic apparatus 1 can receive the response signal within a predetermined time period, processing goes to a next step. However, if the X-radiographic apparatus 1 cannot receive the response signal within the predetermined time period, the X-radiographic apparatus 1 notifies the photography control means 50 that the response signal was not received within the predetermined time period, and stops the rest of the processing. Accordingly, it is possible to prevent a problem that irradiation of X-rays from the X-ray irradiation apparatus 40 is not stopped in an appropriate manner because an X-ray irradiation stop signal, which will be described later, cannot be normally sent to the X-ray irradiation apparatus 40 due to a failure in a wireless communication network or the like.

When the X-radiographic apparatus 1 receives the response signal, the X-radiographic apparatus 1 sends a photography ready signal to the photography control means 50. When the photography control means 50 receives the photography ready signal, the photography control means 50 sends a start photography signal to the X-radiographic apparatus 1.

When the X-radiographic apparatus 1 receives the start photography signal, the X-radiographic apparatus 1 applies a voltage to the solid state detector 20. The X-radiographic apparatus 1 also activates the integral circuit unit 17*a* and the comparison circuit unit 17*b* in the stop-signal output means 17.

When the photographer presses an irradiation switch of the X-ray irradiation apparatus 40 in this state, X-rays are irradiated from the X-ray source 41 to the X-radiographic apparatus 1.

When the X-radiographic apparatus 1 is irradiated with the X-rays, the X-ray dose detector 10, which is incorporated in the X-radiographic apparatus 1, detects the X-rays. Then, a voltage corresponding to the X-ray dose detected by the X-ray dose detector 10 is integrated at the integral circuit unit 17*a*. Further, latent image electric charges which carry X-ray image information are stored in the solid state detector 20. The amount of the latent image electric charges which are stored in the solid state detector 20 is substantially proportional to the dose of the X-rays transmitted through a subject 5. Therefore, the latent image electric charges carry an electrostatic latent image.

If an output from the integral circuit unit 17*a*, in other words, the dose of X-rays irradiated the X-radiographic apparatus 1, exceeds a predetermined value, information that the output has exceeded the predetermined value is output from the comparison circuit unit 17*b*. Specifically, the output information is a stop X-ray irradiation signal. The stop X-ray irradiation signal is output from the communication means 18 to the X-ray irradiation apparatus 40 (communication means 43).

When the communication means 43 in the X-ray irradiation apparatus 40 receives the stop X-ray irradiation signal, the communication means 43 notifies the control means 42 that the stop X-ray irradiation signal is received. When the control means 42 is notified, the control means 42 stops the operation of the X-ray source 41.

After the X-radiographic apparatus 1 sends the stop X-ray irradiation signal to the X-ray irradiation apparatus 40, the X-radiographic apparatus reads out the latent image electric charges from the solid state detector 20. Specifically, the X-radiographic apparatus 1 reads out an image signal from the solid state detector 20. When the X-radiographic apparatus 1 finishes the readout of the image signal, the X-radiographic apparatus 1 sends an image transfer request signal to the photography control means 50. When the photography control means 50 receives the image transfer request signal, the photography control means 50 sends an image transfer ready signal to the X-radiographic apparatus 1.

When the X-radiographic apparatus 1 receives the image transfer ready signal, the X-radiographic apparatus 1 sends the image signal to the photography control means 50. Accordingly, all of the series of processing ends.

So far, preferred embodiments of the present invention have been described. However, the present invention is not limited to the embodiments as described above. For example, the solid state detector may be a solid state detector of a photo-readout type. Further, the present invention may be applied to various kinds of radiographic systems such as a photography system for obtaining mammograms, in which an X-ray irradiation unit and a photography table for mounting a cassette-type X-radiographic apparatus are integrated.

What is claimed is:

1. A radiographic apparatus comprising:

a photo timer comprising:

a radiation dose detector for detecting the dose of radiation irradiated from an external irradiation apparatus;

a stop-signal output means for outputting a stop signal for stopping irradiation from the irradiation apparatus when the radiation dose detector detects a radiation dose which is larger than or equal to a predetermined value; and a stop-signal communication means for sending the stop signal, which is output from the stop-signal output means, to the irradiation apparatus by wireless means;

a solid state detector for recording image information by being irradiated with radiation which carries the image information and outputting an image signal representing the recorded image information; and an image-signal communication means for sending the image signal, output from the solid state detector, to an external apparatus by wireless means;

wherein the stop-signal communication means and the image-signal communication means are configured so that communication from the stop-signal communication means and communication from the image-signal communication means do not interfere with each other;

wherein the stop-signal communication means and the image-signal communication means are separate and independent from each other;

wherein the radiographic apparatus comprises a detection unit that continuously detects failure in wireless communication with the external irradiation apparatus prior to starting irradiation of the subject by the irradiation apparatus; and wherein, when an abnormality is detected by the detection unit of radiographic apparatus, operations are ceased.

2. The radiographic apparatus as defined in claim 1, wherein the radiation dose detector, the stop-signal output means, and the stop-signal communication means are positioned in a same apparatus.

3. The radiographic apparatus as defined in claim 2, wherein the same apparatus is a radiographic apparatus further comprising a solid state detector for recording image information by being irradiated with radiation which carries the image information and outputs an image signal representing the recorded image information and an image-signal communication means for sending the image signal, output from the solid state detector, to an external apparatus by wireless means.

4. The radiographic apparatus as defined in claim 3, wherein the radiographic apparatus communicates wirelessly with the irradiation apparatus via the stop-signal communication means and communicates wirelessly with the external apparatus different from the irradiation apparatus via the image-signal communication means.

5. The radiographic apparatus as defined in claim 4, wherein the external communication apparatus is a photography control unit which controls the radiographic apparatus and wherein the radiographic apparatus controls the irradiation apparatus.

6. The radiographic apparatus as defined in claim 1, wherein the stop-signal output means comprises conversion module which converts value of the radiation dose and a comparison module which compares the converted radiation dose with the predetermined value.

7. The radiographic apparatus as defined in claim 1, wherein the radiation dose detector is formed by stacking a first conductive layer, a photo-conductive layer, a second conductive layer, and an insulating layer, respectively, on a base plate and wherein the first conductive layer is connected to the stop-signal output means.

8. The radiographic apparatus as defined in claim 7, wherein the stop-signal output means comprises a conversion module which converts electric current flowing between the first conductive layer and the second conductive layer into voltage and a comparison module which compares the voltage with the predetermined value.

9. The radiographic apparatus as defined in claim 1, wherein the solid state detector is a thin film transistor type detector.

10. The radiographic apparatus according to claim 1, further comprising:

means for wirelessly receiving a photography request signal from the external apparatus;

means for generating and sending a communication confirmation signal to the external irradiation apparatus in response to the received photography request signal;

means for receiving a response signal from the external irradiation apparatus;

means for determining whether the response signal is received within a predetermined time period;

means for outputting a failure signal indicating wireless communication failure between the radiographic apparatus and the irradiating apparatus to the external apparatus when the determining means determines that the response is not received.

11. The radiographic apparatus according to claim 10, wherein, when wireless communication is set up between the radiographic apparatus and the irradiation apparatus, the outputting means monitors for the failure signal prior to the staffing of the irradiation.

12. A radiographic system comprising:

an irradiation apparatus which irradiates a subject;

a radiographic apparatus which records image information from the irradiated subject; and a control unit which controls radiographic process, wherein the radiographic apparatus comprises a photo timer which determines when to turn off the irradiation apparatus, an image detector which detects the image from the irradiated subject, and a communication module, which wirelessly communicates with the irradiation apparatus and wirelessly communicates with the control unit;

wherein the communication module comprises a first communication sub-module which wirelessly communicates with the irradiating apparatus and a second communication sub-module which wirelessly communicates with the control unit;

wherein the photo timer comprises:

a radiation dose detector which detects the dose of radiation irradiated from an external irradiation apparatus; and a stop-signal output module which outputs a stop signal for stopping irradiation from the irradiation apparatus based on comparison of the radiation dose detected by the radiation dose detector with a predetermined value;

wherein the stop-signal is provided by the stop-signal output module to the first communication module which transmits the stop-signal to the irradiating unit;

wherein the first communication sub-module and the second communication sub-module are separate and independent sub-modules;

wherein the irradiation apparatus and the control unit are separate devices;

wherein the first communication sub-module and the second communication sub-module are configured so that communication from the first communication sub-module and the second communication sub-module do not interfere with each other;

wherein the radiographic apparatus comprises a detection unit that continuously detects failure in wireless communication with the irradiation apparatus prior to starting irradiation of the subject by the irradiation apparatus; and wherein, when an abnormality is detected by the detection unit of the radiographic apparatus, operations are ceased.

13. The radiographic system according to claim 12, wherein the first communication sub-module and the second communication sub-module communicate via different communication methods.

14. The radiographic system according to claim 12, wherein the control unit receives user input and receives via the second communication sub-module the image detected by the detector.

15. The radiographic system according to claim 12, wherein the radiographic apparatus controls the irradiation apparatus via the first communication sub-module.

16. The radiographic system according to claim 12, wherein the radiation dose detector is positioned between the irradiation apparatus and the image detector during photography.

17. The radiographic system according to claim 12, wherein the first and second communication sub-modules are separate adaptors of a wireless network and wherein the irradiating apparatus and the control unit, each has an access point of the wireless network to connect to the wireless adaptors of the radiographic apparatus.

18. The radiographic system according to claim 12, wherein the irradiation apparatus and the control unit are two separate devices and wherein the images detected by the image detector are provided to the control unit by the radiographic apparatus and the stop signal is provided to the irradiating unit by the radiographic apparatus.

19. The radiographic system according to claim 12, wherein the radiographic apparatus comprises:

means for wirelessly receiving a photography request signal from the external apparatus;

means for generating and sending a communication confirmation signal to the external irradiation apparatus in response to the received photography request signal;

means for receiving a response signal from the external irradiation apparatus;

means for determining whether the response signal is received within a predetermined time period;

means for outputting a failure signal indicating wireless communication failure between the radiographic apparatus and the irradiating apparatus to the external apparatus when the determining means determines that the response is not received.

20. The radiographic system according to claim 19 wherein, when wireless communication is set up between the radiographic apparatus and the irradiation apparatus, the outputting means monitors for the failure signal prior to the staffing of the irradiation.

* * * * *